(12) United States Patent
Min et al.

(10) Patent No.: US 10,854,445 B2
(45) Date of Patent: Dec. 1, 2020

(54) INFRARED OPTICAL SENSOR AND MANUFACTURING METHOD THEREOF

(71) Applicant: Electronics and Telecommunications Research Institute, Daejeon (KR)

(72) Inventors: Bok Ki Min, Daejeon (KR); Choon Gi Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 63 days.

(21) Appl. No.: 16/434,143

(22) Filed: Jun. 6, 2019

(65) Prior Publication Data

US 2019/0378716 A1 Dec. 12, 2019

(30) Foreign Application Priority Data

Jun. 8, 2018 (KR) .......................... 10-2018-0066349
Sep. 12, 2018 (KR) .......................... 10-2018-0109229

(51) Int. Cl.

| H01L 21/02 | (2006.01) |
|---|---|
| H01L 21/38 | (2006.01) |
| H01L 21/477 | (2006.01) |
| H01L 29/16 | (2006.01) |
| C23C 14/06 | (2006.01) |
| C23C 16/455 | (2006.01) |
| H01L 29/06 | (2006.01) |

(52) U.S. Cl.
CPC ........ *H01L 21/02568* (2013.01); *C23C 14/06* (2013.01); *C23C 16/45525* (2013.01); *H01L 21/0259* (2013.01); *H01L 21/38* (2013.01); *H01L 21/477* (2013.01); *H01L 29/0657* (2013.01); *H01L 29/1606* (2013.01); *H01J 2201/30469* (2013.01); *H01J 2329/0455* (2013.01)

(58) Field of Classification Search
CPC ........... H01L 21/02568; H01L 21/0259; H01L 21/38; H01L 21/477; H01L 29/1606; H01L 29/0657; H01L 31/09; H01L 31/035209; H01L 31/0324; H01L 21/02485; H01L 21/0262; C23C 14/06; C23C 16/45525; C23C 16/305; C23C 16/448; H01J 2329/0455; H01J 2201/30469
See application file for complete search history.

(56) References Cited

U.S. PATENT DOCUMENTS

| 10,128,126 | B2 | 11/2018 | Park et al. |
|---|---|---|---|
| 2010/0255252 | A1 | 10/2010 | Kim et al. |
| 2016/0035568 | A1 | 2/2016 | Chung et al. |

(Continued)

FOREIGN PATENT DOCUMENTS

| KR | 101548681 B1 | 9/2015 |
|---|---|---|
| KR | 1020170050316 A | 5/2017 |

(Continued)

*Primary Examiner* — Mohammed R Alam
(74) *Attorney, Agent, or Firm* — Rabin & Berdo, P.C.

(57) ABSTRACT

Provided is an infrared optical sensor including a substrate, a channel layer on the substrate, optical absorption structures dispersed and disposed on the channel layer, and electrodes disposed on the substrate, and disposed on both sides of the channel layer, wherein the channel layer and the optical absorption structures include transition metal dichalcogenides.

13 Claims, 9 Drawing Sheets

(56) References Cited

U.S. PATENT DOCUMENTS

2016/0379901 A1* 12/2016 Lin .................. C30B 29/60
                                                                  257/29
2017/0345944 A1* 11/2017 Lin .................. H01L 29/1606
2019/0044009 A1   2/2019 Yeom et al.

FOREIGN PATENT DOCUMENTS

| KR | 101793515 B1 | 11/2017 |
| KR | 101853588 B1 | 4/2018 |

\* cited by examiner

INFRARED OPTICAL SENSOR AND MANUFACTURING METHOD THEREOF

CROSS-REFERENCE TO RELATED APPLICATIONS

This U.S. non-provisional patent application claims priority under 35 U.S.C. § 119 of Korean Patent Application Nos. 10-2018-0066349, filed on Jun. 8, 2018, and 10-2018-0109229, filed on Sep. 12, 2018, the entire contents of which are hereby incorporated by reference.

BACKGROUND

The present disclosure herein relates to an infrared optical sensor and a manufacturing method thereof, and more particularly, to an infrared optical sensor including a transition metal dichalcogenide and a manufacturing method thereof. In particular, the present disclosure relates to an optical sensor in which an optical absorption effect is improved in a near-infrared wavelength due to a localized surface plasmon resonance in a vertical nanostructure.

A two-dimensional material means a material having characteristics in which atoms in each layer are bonded by a strong ionic bond or a covalent bond, but layers thereof are easily dissected because the layers are bonded by the Van der Waals force. Such a two-dimensional material has characteristics that the mobility is very high, since charges are moved and transported within one layer. In particular, a two-dimensional semiconductor has excellent electric, mechanical, and optical characteristics, and thus gets the limelight as a next-generation semiconductor material to be applicable to a flexible element and a transparent element.

A transition metal dichalcogenide is a representative two-dimensional material composed of a bond between a transition metal element and a chalcogenide element. The transition metal dichalcogenide has different band gaps in a bulk state and a monolayer state. In other word, physical and chemical characteristics including a band gap are changed according to the thickness (the number of molecular layers).

However, the transition metal dichalcogenide of a single layer having semiconductor characteristics has limitations in the light absorption efficiency and the wavelength selectivity in the visible range due to a small specific surface area and a unique band gap (1.5 eV to 2.0 eV) thereof.

SUMMARY

The present disclosure provides an infrared optical sensor based on a transition metal dichalcogenide including a three-dimensional nano-structured absorber in which an optical absorption wavelength is extended to the near-infrared region, and a manufacturing method thereof.

The present disclosure also provides a method for adjusting an absorption wavelength according to a plasmon resonance through bonding of a wavelength adjustment element to a nano structure.

The present disclosure further provides an infrared optical sensor of which electrical characteristics are improved, and a manufacturing method thereof.

Issues to be addressed in the present disclosure are not limited to those described above and other issues unmentioned above will be clearly understood by those skilled in the art from the following description.

An embodiment of the inventive concept provides an infrared optical sensor including: a substrate; a channel layer on the substrate; optical absorption structures dispersed and disposed on the channel layer; and electrodes disposed on the substrate, and disposed on both sides of the channel layer, wherein the channel layer and the optical absorption structures includes transition metal dichalcogenides.

In an embodiment, the channel layer may have a two-dimensional crystal structure in which a crystal face is parallel to a surface of the substrate.

In an embodiment, the channel layer may be composed of a mono-molecular layer having one molecular layer, or a multi-molecular layer having a plurality of molecular layers.

In an embodiment, the channel layer and the optical absorption structures may include an identical material.

In an embodiment, widths and heights of the optical absorption structures may be about 1 nm to 10000 nm.

In an embodiment, the infrared optical sensor may further include wavelength adjustment elements chemically bonded to surfaces of the optical absorption structures.

In an embodiment, the wavelength adjustment elements may include hydrogen, oxygen, chalcogenide elements, halogen elements or transition metal elements.

In an embodiment of the inventive concept, a manufacturing method of an infrared optical sensor includes: forming a channel layer on a substrate; growing optical absorption structures on a top surface of the channel layer; and forming electrodes on both sides of the channel layer on the substrate, wherein the forming of the channel layer and the growing of the optical absorption structures include: providing a transition metal element source and a chalcogenide element source in one side of the substrate; providing vapor of the transition metal element source and vapor of the chalcogenide element source on the substrate; and applying heat onto the substrate.

In an embodiment, the channel layer and the optical absorption structures may be formed in an in-situ manner in which identical processes are consecutively performed.

In an embodiment, in the forming of the channel layer, the vapor of the chalcogenide element source may have a first partial pressure ratio over the vapor of the transition metal source element, and in the forming of the optical absorption structures, the vapor of the chalcogenide element source may have a second partial pressure ratio over the vapor of transition metal source element, wherein the second partial pressure ratio may be smaller than the first partial pressure ratio.

In an embodiment, the channel layer and the optical absorption structures may be substantially simultaneously formed.

In an embodiment, the optical absorption structures may be locally grown on the channel layer.

In an embodiment, the channel layer may be laterally grown and formed so as to have a two-dimensional crystal structure parallel to a top surface of the substrate.

In an embodiment, the infrared optical sensor may further include, after forming of the optical absorption structures, bonding wavelength adjustment elements to surfaces of the optical absorption structures.

In an embodiment, the bonding of the wavelength adjustment elements may be performed through gas-assisted plasma treatment, chemical vapor deposition (CVD), or atomic layer deposition (ALD).

In an embodiment, the depositions may be stopped before the wavelength adjustment elements form a layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The embodiments of the present disclosure will now be described with reference to the accompanying drawings for sufficiently understating a configuration and effects of the inventive concept. However, the inventive concept is not limited to the following embodiments and may be embodied in different ways, and various modifications may be made thereto. The embodiments are just given to provide complete disclosure of the inventive concept and to provide thorough understanding of the inventive concept to those skilled in the art. It will be understood to those skilled in the art that the inventive concept may be performed in a certain suitable environment.

The terminology used herein is for the purpose of describing particular embodiments only and is not intended to limit the scope of the present disclosure. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

When a film (or layer) is referred to as being 'on' another film (or layer) or substrate, it can be directly on the other film (or layer) or substrate, or intervening films (or layers) may also be present.

Although the terms first, second, third etc. may be used herein to describe various regions, and films (or layers) etc., the regions and films (or layers) are not to be limited by the terms. The terms may be used herein only to distinguish one region or film (or layer) from another region or film (or layer). Therefore, a layer referred to as a first film in one embodiment can be referred to as a second film in another embodiment. An embodiment described and exemplified herein includes a complementary embodiment thereof. Like reference numerals refer to like elements throughout.

Unless otherwise defined, all terms used herein have the same meaning as commonly understood by one of ordinary skill in the art to which this invention pertains.

Figure 1:
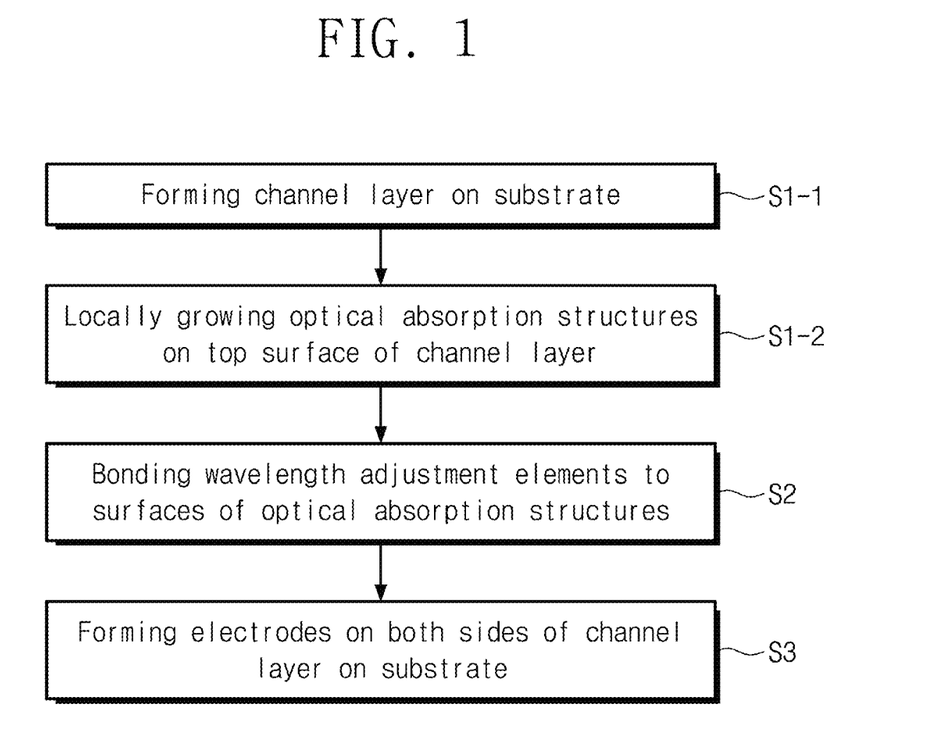
FIG. 1 is a flowchart illustrating a manufacturing method of an infrared optical sensor according to some embodiments of the inventive concept.

Hereinafter, a manufacturing method of an infrared optical sensor according to a concept of the inventive concept will be described with reference to the drawings. FIG. 1 is a flowchart illustrating a manufacturing method of an infrared optical sensor according to some embodiments of the inventive concept. FIGS. 2A to 2D are perspective views for describing a manufacturing method of an infrared optical sensor according to some embodiments of the inventive concept. FIG. 3 is a schematic diagram for describing a formation process of a channel layer and optical absorption structures.

Figure 2A:
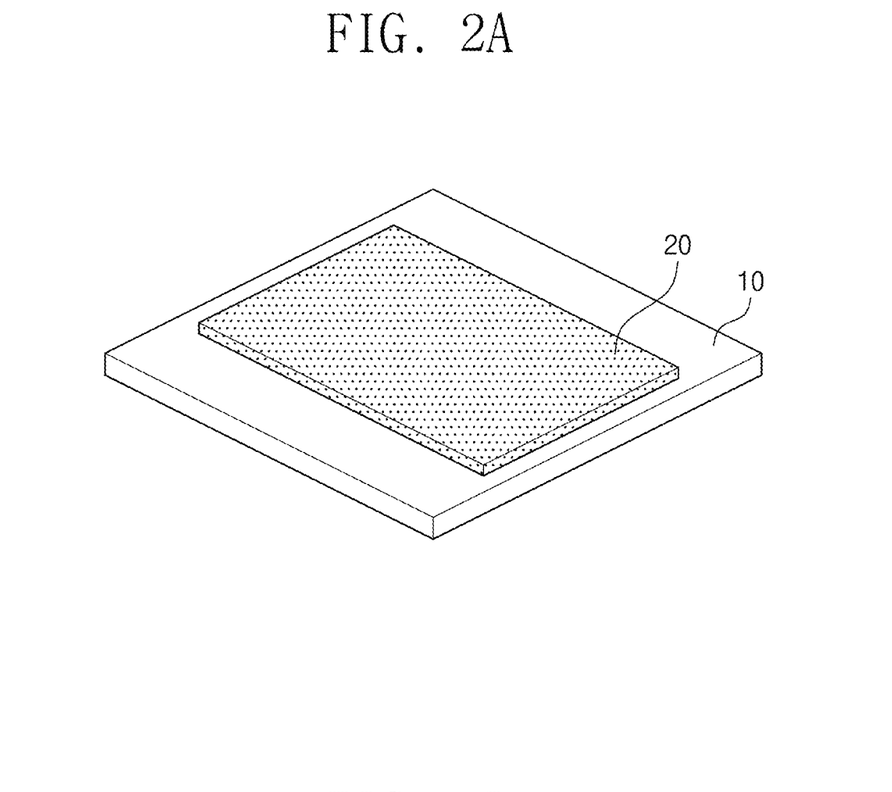
FIGS. 2A to 2D are perspective views for describing a manufacturing method of an infrared optical sensor according to some embodiments of the inventive concept.
Figure 3:
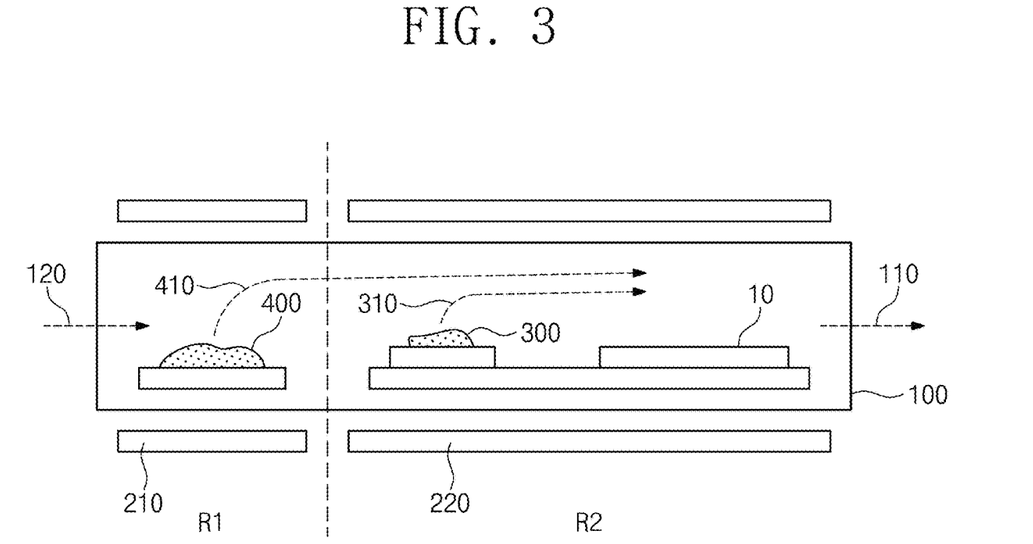
FIG. 3 is a schematic diagram for describing a formation process of a channel layer and optical absorption structures.

Referring to FIGS. 1 and 2A, a substrate 10 may be provided. The substrate 10 may be an insulator substrate, an insulator on metallic substrate, or semiconductor substrate. For example, the substrate 10 may include silicon or silicon dioxide deposited on heavily doped silicon. The substrate 10 may be utilized without being particularly limited only if being a substrate used in a typical semiconductor element.

A preprocessing process may be performed on the substrate 10. For example, the preprocessing process for the substrate 10 may include a thermal treatment process. The preprocessing process may be performed so as to make a chemical reactivity on the surface of the substrate 10 uniform. The preprocessing process for the substrate 10 may not be performed, if necessary.

A channel layer 20 may be formed on the substrate 10 (process S1-1). The channel layer 20 may be formed by chemically bonding a transition metal element and a chalcogenide element on the substrate 10. For example, the channel layer 20 may be formed by thermal chemical vapor deposition. Hereinafter, an embodiment of the formation process S1-1 of the channel layer 20 will be described in detail.

Referring to FIGS. 2A and 3, a chamber 100 may be provided. The inner side of the chamber 100 may be provided in a vacuum state. For example, a vacuum pump 110 may be connected to one side of the chamber 100. The chamber 100 may have a first region R1 and a second region R2. As to be described later, an evaporation reaction may occur in the first region R1, and evaporation and deposition reactions may occur in the second region R2. A carrier gas 120 may be injected into the chamber 100. The carrier gas 120 may flow from the first region R1 to the second region R2. For example, the carrier gas 120 may include argon (Ar). A first heating part 210 and a second hearing part 220 may be provided outside the chamber 100. The first heating part 210 may provide heat to the first region R1, and the second heating part 220 may provide heat to the second region R2.

The substrate 10 may be provided in the chamber 100. The substrate 10 may be provided in the second region R2 of the chamber 100. A transition metal element source 300 and a chalcogenide element source 400 may be provided in the chamber 100. The transition metal element source 300 may be provided in the second region R2 of the chamber 100, and the chalcogenide element source 400 may be provided in the first region R1 of the chamber 100. The transition metal element source 300 and the chalcogenide element source 400 may be provided in a powder type, but the embodiment of the inventive concept is not limited thereto. The transition metal element source 300 may include Ti, Mo, V, Mn, Cr, Fe, Ni, Cu, Co, Nb, Ta, W, Tc, Re, Ru, Os, Rh, Ir, Ag, Au, Pt, Cd, In, Tl, Sn, Pb, Sb, Bi, Zr, Te, Pd, Hf or a compound thereof. For example, the transition metal element source 300 may be $(NH_4)_2MoS_4$, $(NH_4)_6$ $Mo_7O_{24}\cdot4H_2$, $((CH_3)_4N)_2MoS_4$, $((C_2H_5)_4N)_2MoS_4$, $Mo(CO)_6$, $MoCl_5$, $MoOCl_4$, or $MoO_3$. The chalcogenide element source 400 may include an organic compound or an inorganic compound including a sulfide element (S), a selenide element (Se), or a telluride element (Te). For example, the chalcogenide element source 400 may be $H_2S$, $CS_2$, $SO_2$, $S_2$, $(NH_4)_2S$, $C_6H_8OS$, $S(C_6H_4NH_2)_2$, or $Na_2SH_2O$.

First vapor 310 and second vapor 410 may be provided on the substrate 310. The first vapor 10 may be vapor in which the transition metal element source 300 is evaporated, and the second vapor 410 may be vapor in which the chalcogenide element source 400 is evaporated. For example, the transition metal element source 300 is evaporated using the second heating part 220, and the chalcogenide element source 400 may be evaporated using the first heating part 210. The first vapor 310 and the second vapor 410 may be diffused onto the substrate 10 or moved on the substrate 10 by means of the carrier gas 120. The first vapor 310 may be provided into the chamber 100 at a first partial pressure (pp1), and the second vapor 410 may be provided into the chamber 100 at a second partial pressure (pp2). According to the first partial pressure (pp1) and the second partial pressure (pp2), the amounts of the first vapor 310 and the second vapor 410 to be provided onto the substrate 10 may be adjusted. For example, the amounts of heat provided by the first heating part 210 and the second heating part 220 are changed to adjust the amounts of the first vapor 310 and the second vapor 410 generated from the sources 300 and 400, namely, the first partial pressure pp1 and the second partial pressure pp2. Alternatively, the amounts of the first vapor 310 and the second vapor 410 may be adjusted by changing the distance between the substrate 10 and the transition metal element source 300, or the distance between the substrate 10 and the chalcogenide element source 400. For example, the transition metal element source 300 and the chalcogenide element source 400 are disposed adjacent to the substrate 10 to increase the amounts of the first vapor 310 and the second vapor 410 to be provided onto the substrate 10.

The first vapor 310 and the second vapor 410 are reacted to form the channel layer 20 on the substrate 10. For example, seeds are formed on the surface of the substrate 10 through gas phase reactions of the first vapor 310 and the second vapor 410, and the seeds are laterally grown to provide the channel layer 20. In order to improve the reactions of the first vapor 310 and the second vapor 410, heat may be provided onto the substrate 10 using the second heating unit 220. The channel layer 20 may include a transition metal dichalcogenide. The channel layer 20 may have a two-dimensional crystal structure. Here, the two-dimensional crystal structure means a crystal structure in which a bond between component atoms is formed only on a two-dimensional plane, and a weak Van der Waals bond is formed between molecular layers formed by the component atoms to provide a layered structure. The molecular layer of the channel layer 20 may be parallel to the top surface of the substrate 10. In other words, the channel layer 20 may have a structure in which molecular layers are laminated in a direction vertical to the substrate 10. The channel layer 20 may be provided with a mono-molecular layer having one molecular layer, or with a multi-molecular layer having a plurality of molecular layers. As described above, the channel layer 20 may be formed on the substrate 10.

Figure 2B:
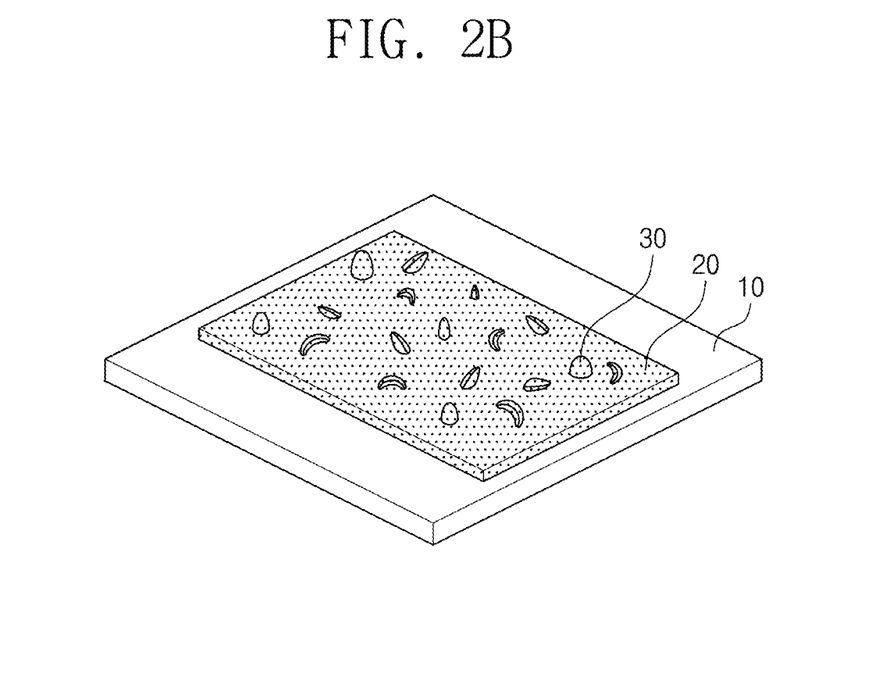

Referring to FIGS. 1 and 2B, optical absorption structures 30 may be grown (process S1-2). The formation process of the optical absorption structures 30 may be identical/similar to the formation process of the channel layer 20. For example, referring to a part of FIG. 3, the substrate 10 on which the channel layer 20 is formed, the transition metal element source 300, and the chalcogenide element source 400 may be provided in the chamber 100. The first vapor 310 and the second vapor 410 may be provided onto the substrate 10 by heating the transition metal element source 300 and the chalcogenide element source 400. In the formation process of the optical absorption structures 30, the first vapor 310 may be provided into the chamber 100 at a third partial pressure (pp3), and the second vapor 410 may be provided into the chamber 100 at a fourth partial pressure (pp4). The first vapor 310 and the second vapor 410 are reacted to provide the optical absorption structures 30 on the channel layer 20. At this point, the partial pressure ratio of the fourth partial pressure pp4 over the third partial pressure pp3 (=pp4/pp3) may be smaller than the partial pressure ratio of the second partial pressure pp2 over the first partial pressure pp1 (=pp2/pp1). In other words, the ratio of the second vapor 410 may be smaller in the formation process S1-2 of the optical absorption structures 30 than in the formation process S1-1 of the channel layer 20. As the ratio of the second vapor 410 including the chalcogenide element is lower, the surface energy of the generated transition metal dichalcogenide may be higher, and a transition metal dichalcogenide cluster having a large size may be provided on the top surface of the channel layer 20. Here, the cluster means an aggregate into which a plurality (for example, several to hundreds) of atoms or molecules are aggregated. Through the above-described processes, the optical absorption structures 30 in a cluster type may be provided on the top surface of the channel layer 20. The optical absorption structures 30 may be locally provided on the top surface of the channel layer 20. The amount and size of the formed optical absorption structures 30 may be adjusted by the partial pressure ratio of the first vapor 310 and the second vapor 410, the process temperature, or the distance between the transition metal element and the substrate 10.

According to embodiments of the inventive concept, the process S1-1 for forming the channel layer 20 and the process S1-2 for forming the optical absorption structures 30 may be proceeded in an in-situ manner in which identical processes are consecutively performed. For example, the process S1-2 for forming the optical absorption structures 30 may be performed after forming the channel layer 20, and by changing the partial pressure ratio of the first vapor 310 and the second vapor 410 and the process temperature in the same chamber 100.

Otherwise, the channel layer 20 and the optical absorption structures 30 may be substantially simultaneously formed. In other words, the process S1-1 for forming the channel layer 20 and the process S1-2 for forming the optical absorption structures 30 may be one process. According to the partial pressure ratio of the first vapor 310 and the second vapor 410 and the process temperature, the channel layer 20 and the optical absorption structures 30 may be substantially simultaneously grown. For example, as the process temperature increases, the channel layer 20 may be grown two-dimensionally by a surface diffusion effect to be easily formed, and the partial pressure of the second vapor 410 is reduced to substantially simultaneously form the optical absorption structures 30 in a cluster type.

As the above, the schemes for forming the channel layer 20 and the optical absorption structures 30 are described, but the embodiment of the inventive concept is not limited thereto. For example, the channel layer 20 and the optical absorption structures 30 may be formed through various vapor depositions such as plasma-enhanced chemical vapor deposition (PeCVD) or thermal chemical vapor deposition (thermal-CVD).

Figure 2C:
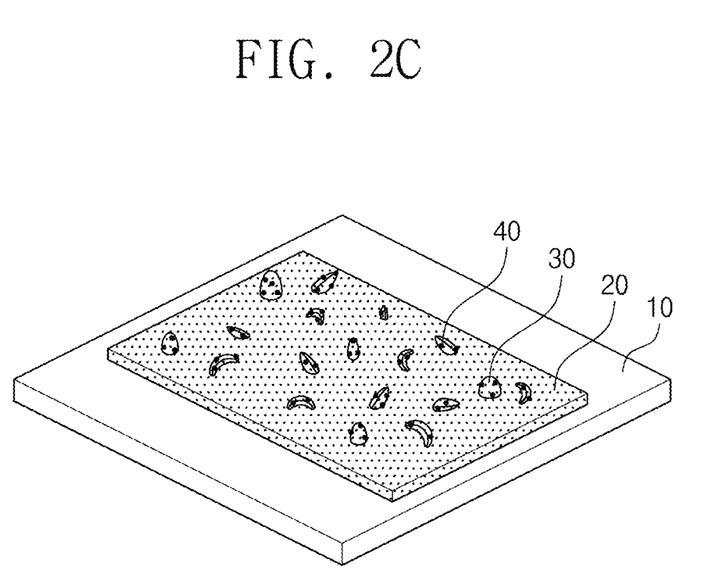

Referring to FIGS. 1 and 2C, a wavelength adjustment element 40 may be bonded to the surfaces of the optical absorption structures 30 (process S2). The wavelength adjustment elements 40 may be chemically or physically bonded to the surfaces of the optical absorption structures 30. Here, each of the wavelength adjustment elements 40 bonded to the surfaces of the optical absorption structures 30 may be a single atom or a single molecule, or, may be a particle type having a plurality of atoms or molecules. The wavelength adjustment elements 40 may be bonded to the surfaces of the optical absorption structures 30 through gas-assisted plasma treatment, CVD, heat treatment or atomic layer deposition (ALD). At this point, the deposition process may be stopped before the wavelength adjustment elements 40 form a layer on the surfaces of the optical absorption structures 30. The wavelength adjustment elements 40 may include hydrogen, oxygen, chalcogenide elements, halogen elements, or transition metal elements.

Figure 2D:
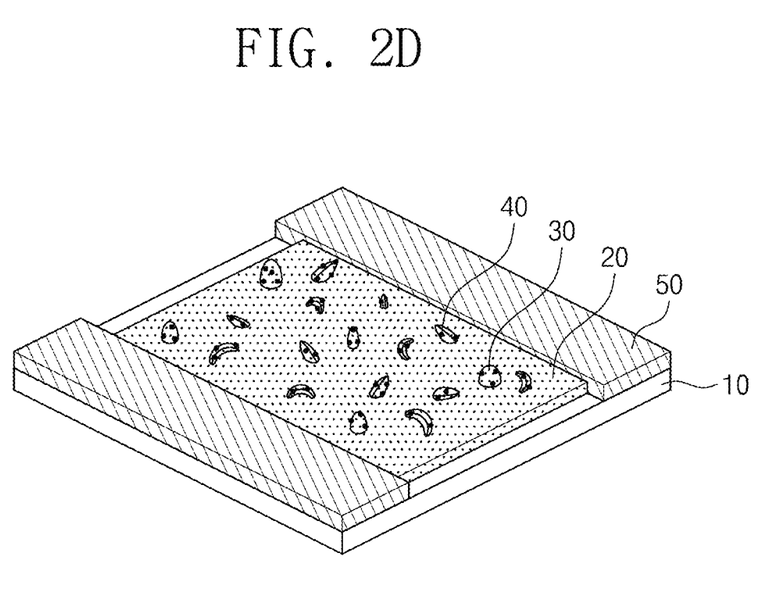

Referring to FIGS. 1 and 2D, electrodes 50 may be formed on the substrate 10 (process S3). The electrodes 50 may be provided on both sides of the channel layer 20, For example, the electrodes 50 may be formed by transferring graphene, or forming and then patterning a conductive film on both sides of the channel layer 20. The electrodes 50 may include graphene, a metal, or a metal compound.

Referring to FIG. 2D, the infrared optical sensor may include a substrate 10, a channel layer 20, optical absorption structures 30, and electrodes 50.

The substrate 10 may include an insulator substrate, an insulator on metallic substrate, or semiconductor substrate. For example, the substrate 10 may include silicon or silicon dioxide deposited on heavily doped silicon.

The channel layer 20 may be disposed on the substrate 10. The channel layer 20 may be composed of a semiconductor material having a two-dimensional crystal structure. For example, the channel layer 20 may include a transition metal dichalcogenide. A molecular layer of the channel layer 20 may be parallel to the top surface of the substrate 10. The channel layer 20 may be provided with a mono-molecular layer having one molecular layer, or a multi-molecular layer having a plurality of molecular layers.

The optical absorption structures 30 may be disposed on the channel layer 20. The optical absorption structures 30 may be dispersed and provided on the top surface of the channel layer 20. The optical absorption structures 30 may have a cluster shape. For example, each of the optical absorption structures 30 may have a nano flake or nano plate shape. The width and height of each of the optical absorption structures 30 may be about 1 nm to about 10,000 nm. The optical absorption structures 30 may be composed of the same material as that of the channel layer 20. For example, the optical absorption structures 30 may include transition metal dichalcogenides.

According to the embodiments of the inventive concept, an infrared optical sensor may have optical absorption structures 30 of a cluster shape, which are locally disposed on the channel layer 20 that is a two-dimensional semiconductor. The optical absorption structures 30 of the cluster shape may have defects by chemical bonding between atoms on the surface. Accordingly, the surfaces of the optical absorption structures 30 may have a high electron density, and cause a localized surface plasmon resonance. In other words, the infrared optical sensor may absorb light using the optical absorption structures 30, and move charges generated by the absorbed light through the channel layer 20.

Furthermore, the sizes, a quantity, and the charge concentrations of the optical absorption structures 30 may change the resonance frequency of the localized surface plasmon resonance. In other words, for the infrared optical sensor, a desired absorption wavelength band of light may be controlled by adjusting the sizes, quantity and charge concentrations of the light absorption structures 30.

The wavelength adjustment elements 40 may be bonded onto the surfaces of the optical absorption structures 30. The wavelength adjustment elements 40 may be chemically bonded to the defects of the surfaces of the optical absorption structures 30. The wavelength adjustment elements 40 are bonded to the surfaces of the optical absorption structures 30 to increase or decrease the electron density of the surfaces of the optical absorption structures 30. Accordingly, the resonance frequency of the localized surface plasmon resonance may be changed. In other words, for the infrared optical sensor, a desired absorption wavelength band of light may be adjusted by bonding the wavelength adjustment elements 40 to the surfaces of the light absorption structures 30.

The electrodes 50 may be disposed on the substrate 10. The electrodes 50 may be disposed on both sides of the channel layer 20. The electrodes 50 may include graphene, a metal, or a metal compound.

Experimental Example 1

As a substrate, a silicon dioxide deposited on heavily doped silicon ($SiO_2$/Si) substrate was used. As transition metal element source, $MoO_3$ was used, and as a chalcogenide element source, sulfide powder was used. The substrate, the transition metal element source, and the chalcogenide element source were disposed in a chamber, and then the inner side of the chamber was maintained under vacuum. Then, after a carrier gas was injected into the chamber, heat was applied to the chamber to form a channel layer and optical absorption structures on the substrate. The channel layer was formed so as to have a mono-molecular layer of $MoS_2$, and the optical absorption structures were provided so as to have $MoS_2$ vertically grown on the surface of the channel layer. Then, metal electrodes (Ti/Au) were formed on both sides of the channel layer to manufacture an infrared optical sensor. The infrared optical sensor was manufactured to absorb light in the infrared region.

Experimental Example 2

A plasma treatment process using oxygen was performed on the result of Experimental example 1 to bond wavelength adjustment elements to the surfaces of the optical absorption structures. As the wavelength adjustment elements, oxygen was used.

Comparative Example

The same processes as example 1 were performed, but it was not allowed to form the optical absorption structures on the channel layer.

Figure 4A:
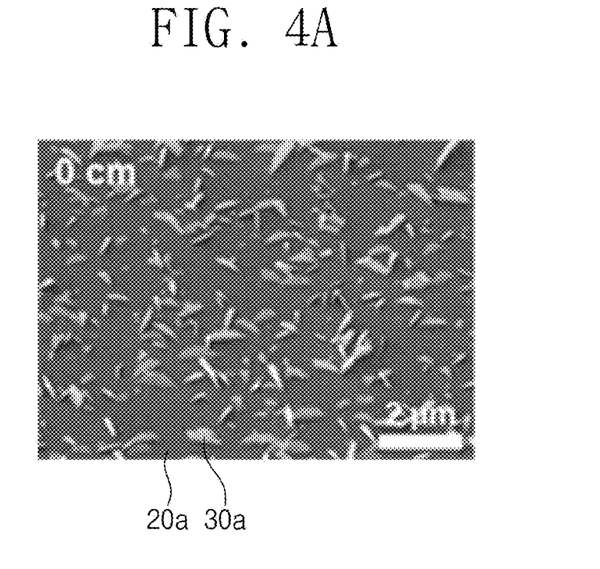
FIGS. 4A to 4C are photographs of a channel layer and optical absorption structures provided according to Experimental example 1.
Figure 4B:
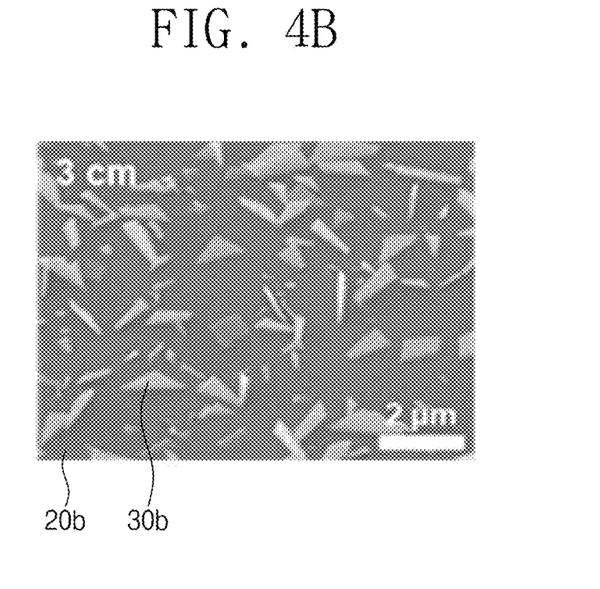
Figure 4C:
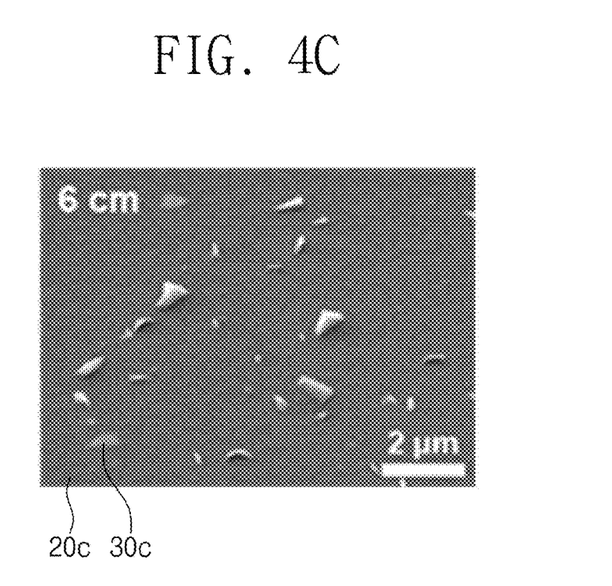

FIGS. 4A to 4C are photographs of the channel layer and the optical absorption structures provided according to Experimental example 1. FIG. 4A illustrates an infrared optical sensor in which a channel layer 20a and optical absorption structures 30a are provided in a state where the distance between the transition metal source and the substrate is about 0 cm, FIG. 4B illustrates an infrared optical sensor in which the channel layer 20b and the optical absorption structures 30b were provided in a state where the distance between the transition metal source and the substrate is about 3 cm, and FIG. 4C illustrates an infrared optical sensor in which the channel layer 20c and the optical absorption structures 30c are provided in a state where the distance between the transition metal source and the substrate is about 6 cm. Referring to FIGS. 4A to 4C, it may be checked that the channel layers 20a, 20b, and 20c, and the optical absorption structures 30a, 30b, and 30c are formed. In other words, it may be understood that, in a manufacturing method of an infrared optical sensor according to an embodiment of the inventive concept, the distance between the transition metal source and the substrate is adjusted to control the quantity of formed optical absorption structures.

Figure 5:
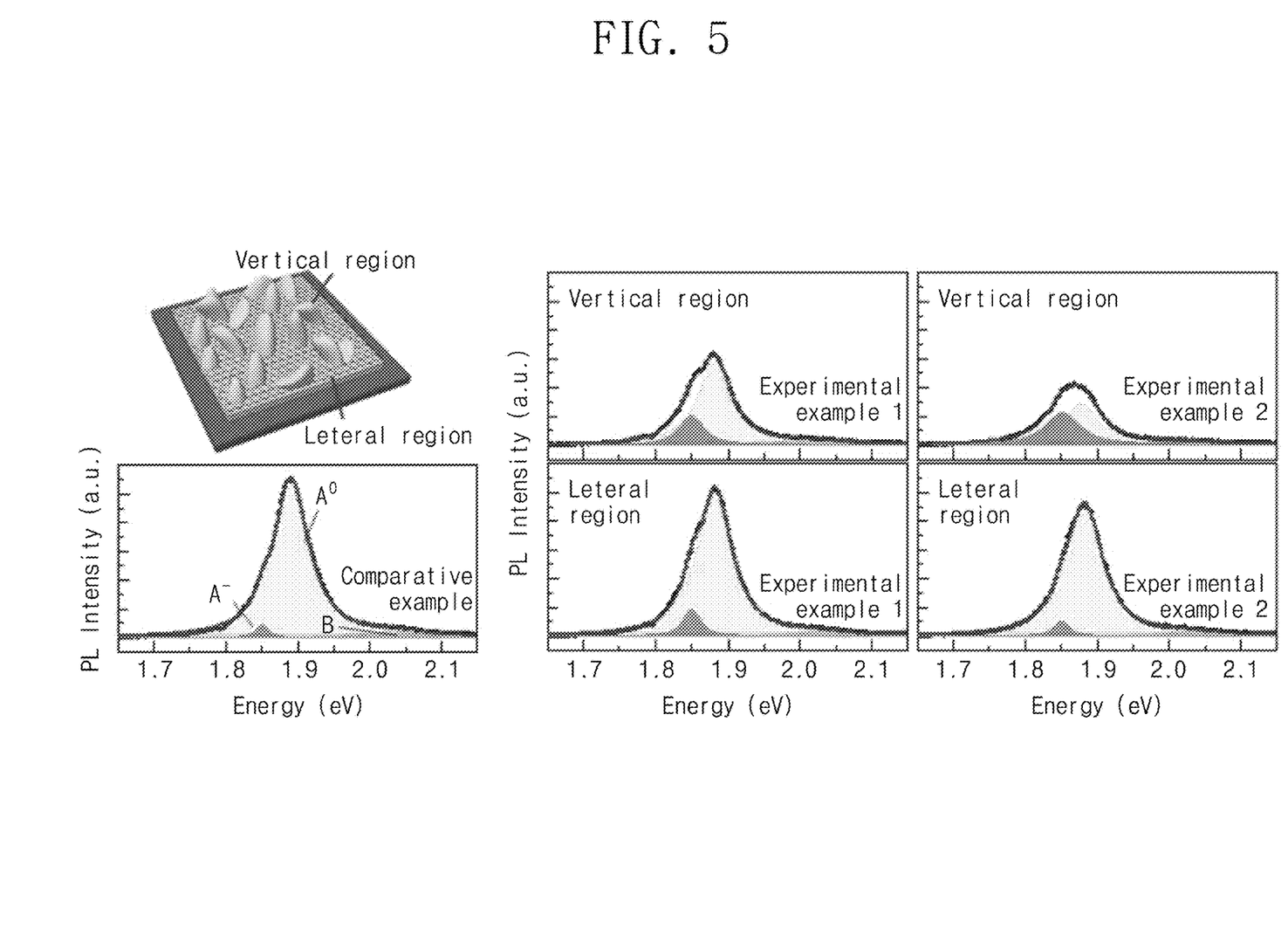
FIG. 5 is a graph showing results of measuring light emission spectrums according to optical excitation of Experimental examples and a Comparative example.

FIG. 5 is a graph showing results of measuring light emission spectrums according to optical excitation of the Experimental examples and the Comparative example. After irradiating the Experimental examples and the Comparative example with laser light of a 532 nm wavelength, the energy of emitted light was measured. With reference to FIG. 5, in a monolayer of $MoS_2$, an A exciton is formed by optical excitation due to incident light at K and K' points of the Brillouin zone, and a B exciton having the energy of 2.02 eV is formed by spin-orbital splitting of the valence band. The A exciton is divided into an A0 exciton having energy of 1.85 eV formed from combination of one electron and one hole, and an A-exciton having energy of 1.88 eV formed from combination of two electrons and one hole. The A-exciton is related to the electron concentration, and as the electron concentration increases, a peak caused by the A-exciton increases. With reference to FIG. 5, it may be understood from Experimental example 1 that the size of the A-exciton in a vertical structure of $MoS_2$ further increases than the size of the A-exciton in a lateral region. In addition, it may be seen from Experimental example 2 that the size of the A-exciton further increases in comparison to that in Experimental example 1. As a result of calculating the charge concentration in the vertical structure through the electric charge conservation law using spectrum analysis results according to measurements of FIG. 5, it may be understood that the charge concentration increases from $3 \times 10^{20}$ $cm^{-3}$ in Experimental example 1 to $9 \times 10^{20}$ $cm^{-3}$ in Experimental example 2 according to presence or absence of an oxygen plasma. This reflects that the charge concentration increases in a nano-structure according to bonding of oxygen. Typically, the wavelength of a localized surface plasmon resonance in a semiconductor is caused by the charge concentration in the semiconductor. For a two-dimensional transition metal dichalcogenide having semiconductor characteristics, typically, a localized surface plasmon resonance may occur in the far-infrared region or the terahertz region with the charge concentration of $10^{12}$ $cm^{-3}$ to $10^{14}$ $cm^{-3}$. Accordingly, in order to make the localized surface plasmon resonance occur in the visible region or the near-infrared region, the charge concentration of $10^{20}$ $cm^{-3}$ or more is necessary. $MoS_2$ having the nano-structure in which an oxygen plasma is treated according to the embodiments of the inventive concept has the charge concentration of $9 \times 10^{20}$ $cm^{-3}$, and thus, through plasmonic resonance dispersion relations, it may be predicted that a plasmon resonance may occur in the near-infrared region of about 960 nm.

Figure 6:
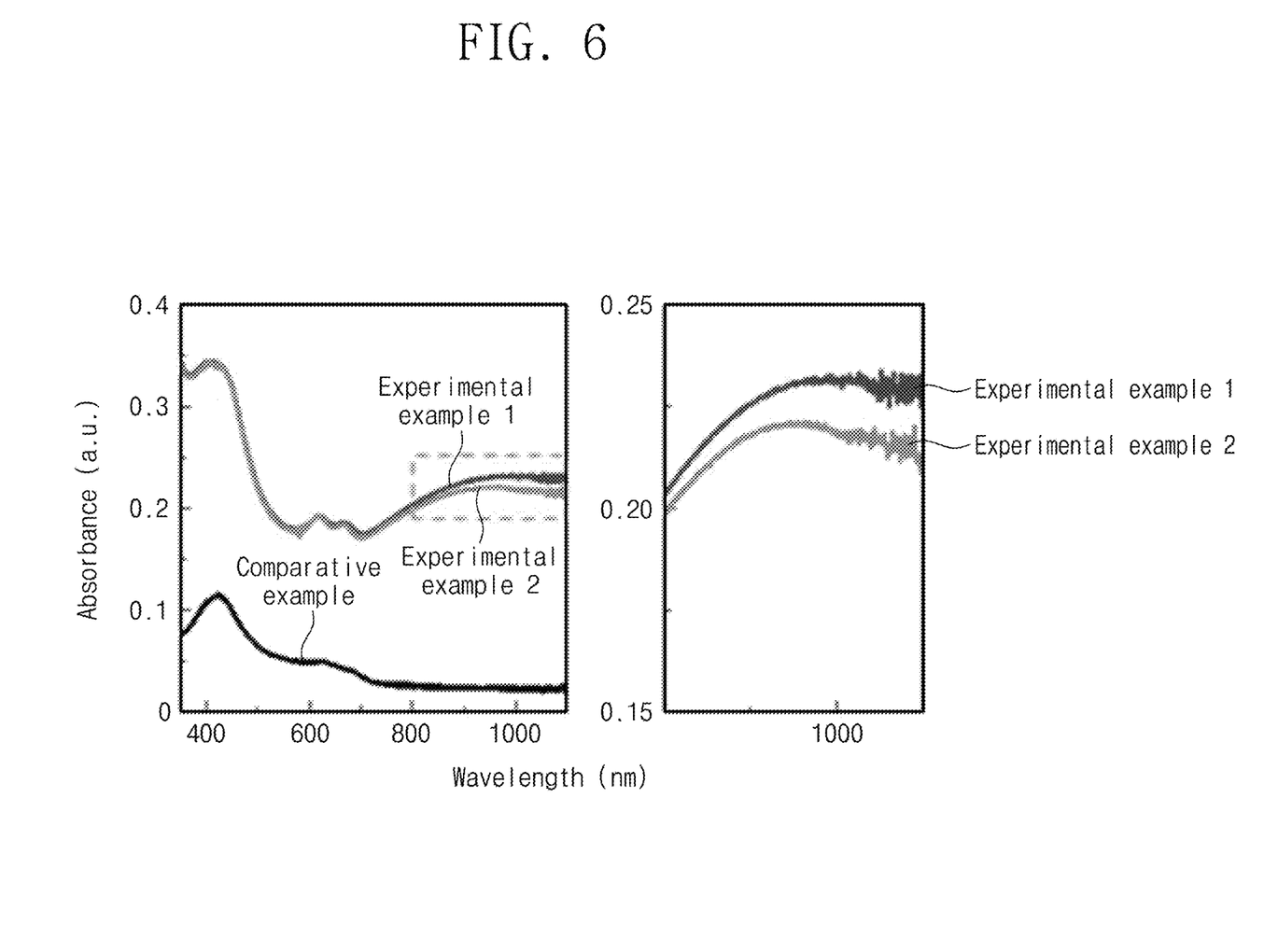
FIG. 6 is a graph showing results of measuring optical absorption spectrums of the Experimental examples and the Comparative example.

FIG. 6 is a graph showing results of measuring optical absorption spectrums of the Experimental examples and the Comparative example. The amount of absorbed light was measured by irradiating Experimental example 1, Experimental example 2, and the Comparative example with light having about a 200 nm to 1200 nm wavelength. Referring to FIG. 6, the Comparative example shows a very low absorption peak at a 300 nm to 500 nm wavelength of incident light, and does not show an absorption peak in other wavelengths. Whereas, Experimental example 1 and Experimental example 2 show high absorption peaks at an 800 nm to 1000 nm wavelength, which corresponds to an infrared ray, of the incident light. In other words, it may be checked that an infrared optical sensor of an embodiment of the inventive concept shows a high absorption ratio for light of a desired absorption wavelength. In addition, in Experimental example 2, the absorption peak was found at a lower wavelength than that in Experimental example 1. In Experimental example 1 and Experimental example 2, it may be checked that central wavelengths of the plasmon resonance are respectively about 1000 nm and about 950 nm in the near-infrared region. In other words, in Experimental example 2, the absorption peak was found at a lower wavelength than that in Experimental example 1. With reference to FIG. 5, this means that since Experimental example 2 has a higher charge concentration than example 1, the plasmon resonance occurs at a lower wavelength. In other words, it may be understood that an absorption wavelength of an infrared optical sensor of an embodiment of the inventive concept may be adjusted through the wavelength adjustment elements.

Figure 7:
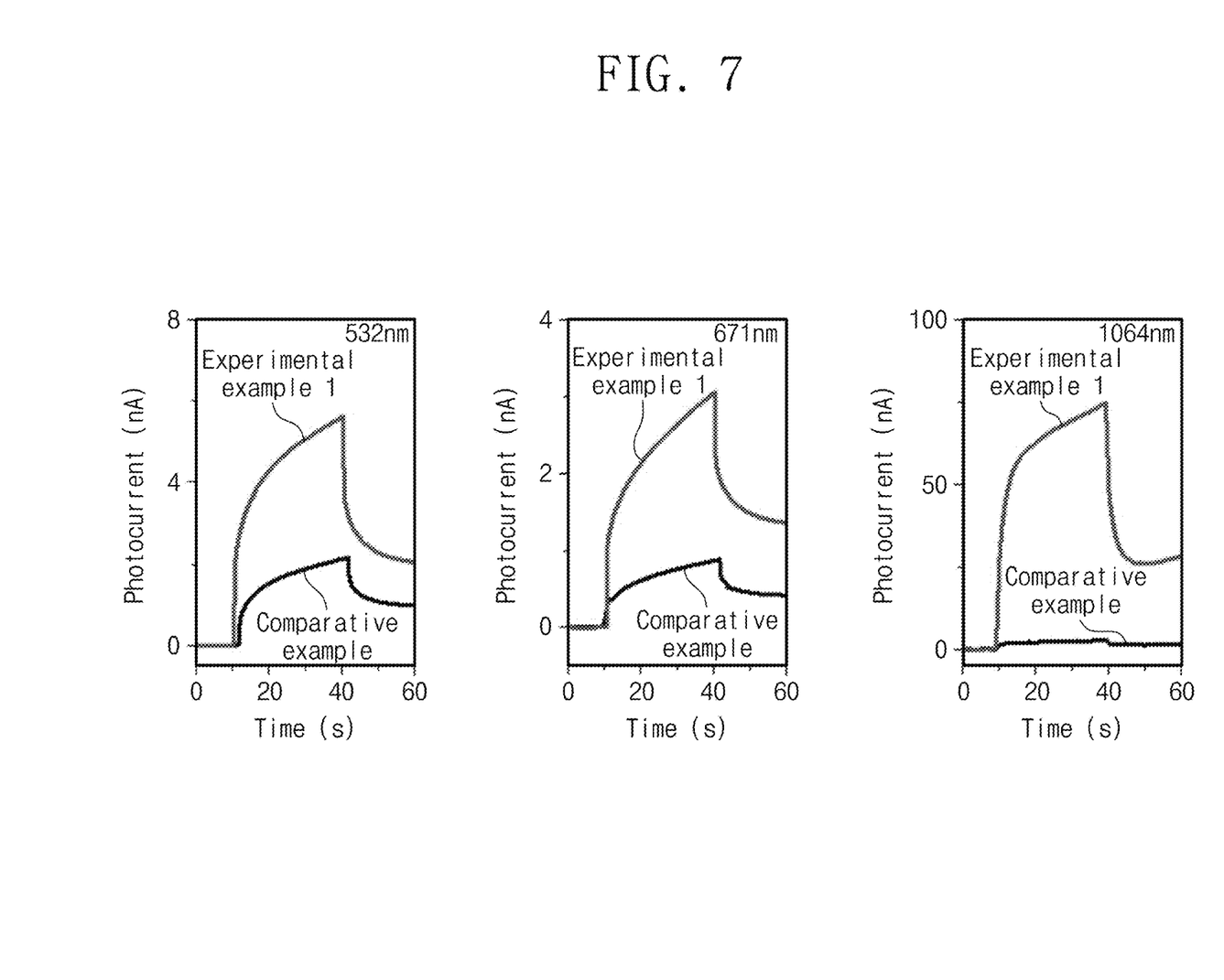
FIG. 7 is a graph showing results of measuring optical currents of the Experimental examples and the Comparative example.

FIG. 7 is a graph showing results of measuring optical currents of Experimental example 1 and the Comparative example. Experimental example 1 and the Comparative example are irradiated with light having wavelengths of 532 nm, 672 nm, and 1064 nm, and then optical currents flowing through the electrodes are measured. Referring to FIG. 7, for the light of each wavelength, a higher optical current is measured in Experimental example 1 than that in the Comparative example. From this, it may be understood that optical absorption ability is improved due to a high specific surface area, and a localized plasmon resonance occurs due to a high charge concentration. Accordingly, Experimental example 1 means that absorption increases in the near-infrared region and thus the optical current increases in comparison to that of the Comparative example. In other words, it may be checked that an infrared optical sensor of an embodiment of the inventive concept shows high sensitivity in the near-infrared region as well as the visible region.

An infrared optical sensor according to embodiments of the inventive concept may have optical absorption structures of a cluster shape, which are locally disposed on a channel layer. The infrared optical sensor may absorb light using the optical absorption structures, and move charges generated by the absorbed light through the channel layer.

In addition, the infrared optical sensor may improve the optical absorption ability in the visible range and the infrared range due to a three-dimensional shape of the optical absorption structure and a localized surface plasmon shape generated by high charge density.

In addition, for the infrared optical sensor, a desired absorption wavelength band of light may be easily adjusted by adjusting the sizes and quantity of the light absorption structures.

The infrared optical sensor may bond wavelength-adjusted elements to the surfaces of the optical absorption structures to easily control the desired absorption wavelength band of light.

The exemplary embodiments of the present disclosure have been described above with reference to the accompanying drawings, but those skilled in the art will understand that the present disclosure may be implemented in another concrete form without changing the technical spirit or an essential feature thereof. Therefore, the aforementioned exemplary embodiments are all illustrative and are not restricted to a limited form. Therefore, these embodiments as described above are only proposed for illustrative purposes and do not limit the present disclosure.

What is claimed is:

1. An infrared optical sensor comprising: a substrate; a channel layer on the substrate; optical absorption structures dispersed and disposed on the channel layer; and electrodes disposed on the substrate, and disposed on both sides of the channel layer, wherein the channel layer and the optical absorption structures comprise transition metal dichalcogenides; and further comprising: wavelength adjustment elements chemically bonded to surfaces of the optical absorption structures.

2. The infrared optical sensor of claim 1, wherein the channel layer has a two-dimensional crystal structure in which a crystal face is parallel to a surface of the substrate.

3. The infrared optical sensor of claim 2, wherein the channel layer is composed of a mono-molecular layer having one molecular layer, or a multi-molecular layer having a plurality of molecular layers.

4. The infrared optical sensor of claim 1, wherein the channel layer and the optical absorption structures comprise an identical material.

5. The infrared optical sensor of claim 1, wherein widths and heights of the optical absorption structures are about 1 nm to about 10000 nm.

6. The infrared optical sensor of claim 1, wherein the wavelength adjustment elements comprise hydrogen, oxygen, chalcogenide elements, halogen elements or transition metal elements.

7. A manufacturing method of an infrared optical sensor comprising: forming a channel layer on a substrate; growing optical absorption structures on a top surface of the channel layer; and forming electrodes on both sides of the channel layer on the substrate, wherein the forming of the channel layer and the growing of the optical absorption structures comprise: providing a transition metal element source and a chalcogenide element source in one side of the substrate; providing vapor of the transition metal element source and vapor of the chalcogenide element source on the substrate; and applying heat onto the substrate; and further comprising: after forming of the optical absorption structures, bonding wavelength adjustment elements to surfaces of the optical absorption structures.

8. The infrared optical sensor of claim 7, wherein the channel layer and the optical absorption structures are formed in an in-situ manner in which identical processes are consecutively performed.

9. The infrared optical sensor of claim 8, wherein, in the forming of the channel layer, the vapor of the chalcogenide element source has a first partial pressure ratio over the vapor of the transition metal source element, and in the forming of the optical absorption structures, the vapor of the chalcogenide element source has a second partial pressure ratio over the vapor of transition metal source element, wherein the second partial pressure ratio is smaller than the first partial pressure ratio.

10. The infrared optical sensor of claim 7, wherein the channel layer and the optical absorption structures are substantially simultaneously formed.

11. The infrared optical sensor of claim 7, wherein the optical absorption structures are locally grown on the channel layer.

12. The infrared optical sensor of claim 7, wherein the channel layer is laterally grown and formed so as to have a two-dimensional crystal structure parallel to a top surface of the substrate.

13. The infrared optical sensor of claim 7, wherein the bonding of the wavelength adjustment elements is performed through gas-assisted plasma treatment, chemical vapor deposition (CVD), or atomic layer deposition (ALD).

* * * * *